United States Patent [19]

Eyermann et al.

[11] Patent Number: 4,604,573
[45] Date of Patent: Aug. 5, 1986

[54] DRIFT RESISTANT MAGNET STRENGTH SIGNAL EVALUATION CIRCUIT

[76] Inventors: Manfred Eyermann, Vaihingerstrasse 109, D-7132 Illingen; Günter Kettenacker, Wolfsgasse 34, D-7141 Höpfigheim; Kurt Zimmermann, Berliner Strasse 8, D-7120 Bietigheim, all of Fed. Rep. of Germany

[21] Appl. No.: 435,405

[22] Filed: Oct. 20, 1982

[30] Foreign Application Priority Data

Mar. 2, 1982 [DE] Fed. Rep. of Germany ....... 3207370

[51] Int. Cl.$^4$ .................... G01N 27/74; G01R 33/12
[52] U.S. Cl. .................................................. 324/205
[58] Field of Search ............... 324/205, 228, 239, 226; 209/567; 307/362, 542, 543; 328/169

[56] References Cited

U.S. PATENT DOCUMENTS

| | | | |
|---|---|---|---|
| 3,706,027 | 12/1972 | Grice, Jr. et al. | 324/205 |
| 4,058,763 | 11/1977 | Steingroever | 324/205 |
| 4,068,138 | 11/1978 | Miyakawa et al. | 307/362 |

FOREIGN PATENT DOCUMENTS 0760005  8/1980  U.S.S.R. ............................ 324/205

Primary Examiner—Ernest F. Karlsen
Assistant Examiner—Walter E. Snow

[57] ABSTRACT

To test magnetic elements, by integrating output signals derived from a sensing coil to which the magnetic elements are exposed, by being passed therethrough, the output signals are additionally applied to a threshold switch, which activates the integrator only if (a) the output signals exceed a given threshold, and (b) they are in a predetermined polarity, so that the integrator will not integrate first in one and then in reverse direction, thus providing no useful output signals. The system is simple and avoids the necessity of special circuitry.

3 Claims, 1 Drawing Figure

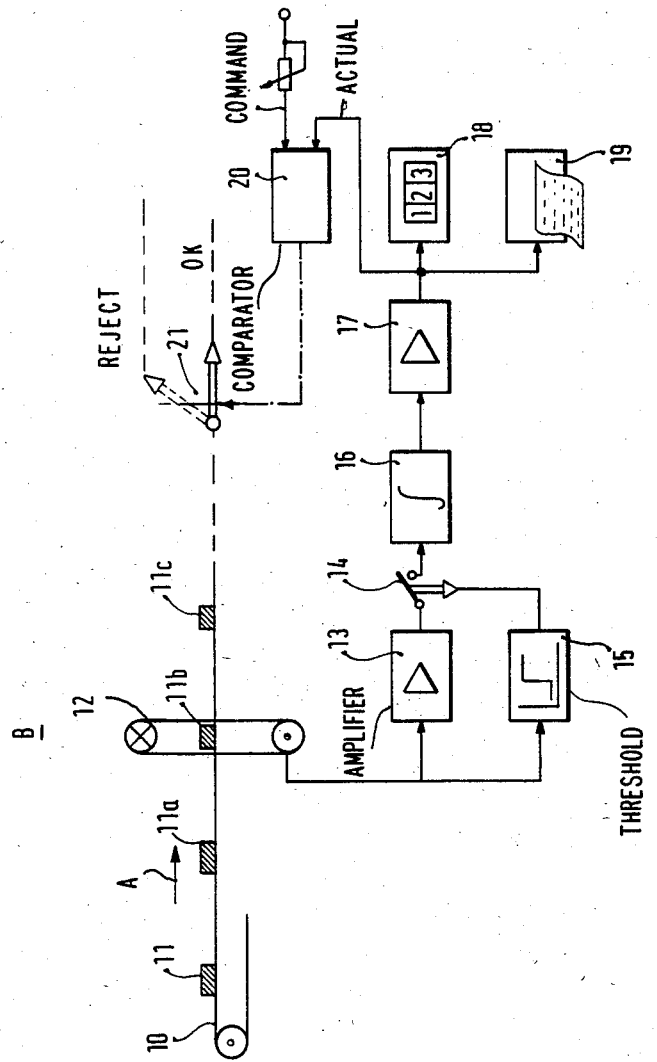

DRIFT RESISTANT MAGNET STRENGTH SIGNAL EVALUATION CIRCUIT

The present invention relates to an apparatus to test magnetic components or structural elements, and more particularly to test permanent magnets, for example permanent magnets to be used in electric motors and the like.

BACKGROUND

Permanent magnets and other magnetic elements can be tested by passing the elements or components through a coil and integrating the resulting voltage induced in the coil. This is a well-known and tried method which, however, has some disadvantages. Customarily used integrators have a comparatively high drift. Thus, if quiescent or remainder signals are applied to the integrator, or noise signals reach the integrator, it will also integrate such signals and thus not provide appropriately controlled output signals. Integrators, of course, are polarity sensitive. If magnetic elements are passed through a coil and then removed, the time integral of the induced voltage will be zero since first a positive, and then a negative voltage will be induced in the coil, resulting in an overall integral of zero, so that no remaining measurable output can be sensed. To prevent such zero output, additional circuitry may be needed which, usually, is quite complex and introduces additional errors, and particularly drift errors.

THE INVENTION

It is an object to simplify test apparatus for magnetic components, and particularly to provide a system which is suitable for testing of magnetic components under mass production conditions, for example upon being supplied on a conveyor in a manufacturing assembly line.

Briefly, the customarily used test coil is connected to a customarily used integrator through a controlled switch. The output from the test coil is additionally connected to a threshold circuit which is responsive to both polarity and level of the output signal and, in turn, provides an output to close the connection from the sensing coil to the integrator only upon the concurrence of the conditions:

(a) the polarity of the output signal is in accordance with a predetermined or preset polarity, and
(b) the level of the output signal is above a predetermined threshold.

The system has the advantage that disturbances due to drift are effectively prevented, resulting in more accurate measurement. At the termination of measuring, a remanent measuring value will be obtained which can be readily displayed, recorded, or otherwise evaluated, for example by controlling flow of the tested components, to either continue for utilization or to be rejected. The threshold circuit permits suppression of low signals, thus preventing drift from affecting the integrator.

DRAWING

The single FIGURE is a schematic illustration of the testing system.

DETAILED DESCRIPTION

A production line, including a conveyor 10, transports a plurality of magnetic elements 11, 11a, 11b, 11c in the direction of the arrow A to a measuring station B. The conveyor belt 10 may, for example, be part of a continuous production line receiving permanent magnets for installation in electric motors, or a portion of a production line in which such permanent magnets are transported from a supply or storage station to a utilization point.

The components 11, 11a, 11b... pass through a sensing coil 12. Upon passage of the magnetic components therethrough, a voltage is induced in the coil 12. As shown in the drawing, the component 11b just is being passed through the coil 12 and thus will cause induction of a voltage within the coil 12. This voltage, which will be in form of a pulse or undulating voltage, is amplified in an amplifier 13, the output of which is connected through a controlled switch 14 to the input of an integrator 16. Integrator 16 is connected to a further amplifier 17 which provides output signals to control an indicator 18, a printer 19, and further controls a comparator 20 which compares the output signal with a command or reference value applied thereto. If the output signal has a certain relationship with respect to the command or reference signal, for example being equal or greater, a switch 21 is respectively controlled to pass the proper magnet for further production through an "O.K." line; if the comparison indicates a defective magnet, the switch 21 is controlled to pass the magnet to a "reject" line. The actual indicated value is displayed in display 18, and the printer 19 will print out the indentification of the rejected part.

OPERATION

The voltage induced in the coil 12 is connected not only to the amplifier 13 but also to the threshold switch 15. The threshold level in the threshold switch 15 is so set that small signals are suppressed thereby and, additionally, that signals of only a given polarity are being sensed. Signals which are of opposite polarity are also suppressed, that is, they do not fall above the threshold level of the first polarity. If the voltage provided from the coil 12 is in excess of the threshold level of threshold switch 15 in the proper polarity, the voltage from the amplifier 13 is then applied to the integrator 16, which appropriately controls or provides output signals through amplifier 17 to comparator 20 and the display and printer 18, 19. The threshold stage 15, of course, not only will cut off values of the signal below a predetermined threshold, but also will respond only to signals of a predetermined polarity. Consequently, integrator 16 will integrate only a half-wave of the voltage which exceeds the threshold, and which is induced in the coil 12 upon passage of the respective component 11 therethrough. The threshold stage, thus, suppresses small signals and signals of improper polarity. Consequently, the output derived from the integrator will be a true measure of the magnetic induction provided by the magnets 11, 11a....

We claim:

1. Apparatus, including a drift-resistant evaluation circuit, for testing the strength of each of a sequence of magnetic components (11, 11a, 11b, 11c) of substantially identical physical orientation, having
    an electromagnetic sensing means (12) providing an output signal representative of the magnetic strength of the component being tested,
    an amplifier (13) for receiving and amplifying said output signal, and an integrator (16) connected to receive the output signal, integrating the output signal over time, and providing an output control signal, wherein, in order to prevent noise signals and signals of undesired polarity from reaching said integrator (16) and resulting in drift of said output control signal away from values representative solely of said magnetic strength, there are provided:

a polarity-sensitive threshold circuit (15) connected in parallel with said amplifier, for receiving the output signal and testing said output signal to see if it exceeds a predetermined threshold with a given polarity and controlled switching means (14), connected in said evaluation circuit in advance of the integrator (16), connected to and controlled by said threshold circuit (15), and applying the output signal from said sensing means to the integrator only if (a) the polarity of the output signal is in accordance with predetermined polarity; and (b) the level of the output signal is above a predetermined threshold level, thereby preventing noise signals below said threshold level and output signals of polarity opposite to said predetermined polarity from reaching and being integrated by said integrator.

2. Apparatus according to claim 1, wherein the sensing means comprises a coil (12), and the magnetic components comprise permanent magnets, the integrator integrating the voltage induced in the coil (12) upon moving said permanent magnet through the coil.

3. Apparatus according to claim 1, including comparator means (20) comparing the output signal from the integrator with a reference;

and component switching means (21) to respectively switch the components from a first path to a second path in dependence on the comparison effected by said comparator.

* * * * *